(12) United States Patent
Nishiyama et al.

(10) Patent No.: US 8,004,071 B2
(45) Date of Patent: Aug. 23, 2011

(54) SEMICONDUCTOR MEMORY DEVICE

(75) Inventors: Taku Nishiyama, Kanagawa-ken (JP); Tetsuya Yamamoto, Kanagawa-ken (JP); Naohisa Okumura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 269 days.

(21) Appl. No.: 12/343,921

(22) Filed: Dec. 24, 2008

(65) Prior Publication Data
US 2009/0166829 A1 Jul. 2, 2009

(30) Foreign Application Priority Data

Dec. 27, 2007 (JP) ................................. 2007-335665
Dec. 27, 2007 (JP) ................................. 2007-335666

(51) Int. Cl.
 H01L 23/495 (2006.01)
 H01L 23/48 (2006.01)
 H01L 23/12 (2006.01)
(52) U.S. Cl. ......... 257/676; 257/E23.031; 257/E23.003; 257/E23.01; 257/E23.141; 257/E23.18; 257/686; 257/723; 257/690; 257/777; 257/786; 257/784; 257/528; 257/724; 257/728
(58) Field of Classification Search ................... 257/676, 257/E23.031, 777, 723, 686, 685, 784, 786, 257/528, 728, 724, E23.069, E23.18, E25.001, 257/E23.141, 690, E23.003
See application file for complete search history.

(56) References Cited

U.S. PATENT DOCUMENTS

| | | | |
|---|---|---|---|
| 5,563,086 A * | 10/1996 | Bertin et al. ................... | 438/15 |
| 5,780,925 A | 7/1998 | Cipolla et al. | |
| 7,423,336 B2 * | 9/2008 | Corisis et al. ................. | 257/686 |
| 7,550,834 B2 * | 6/2009 | Yu et al. ........................ | 257/686 |
| 7,687,921 B2 * | 3/2010 | Hiew et al. .................... | 257/777 |
| 7,704,794 B2 * | 4/2010 | Mess et al. .................... | 438/112 |
| 7,855,446 B2 * | 12/2010 | Nishiyama et al. ........... | 257/686 |
| 2001/0010397 A1 | 8/2001 | Masuda et al. | |
| 2006/0076690 A1 | 4/2006 | Khandros et al. | |
| 2007/0035002 A1 | 2/2007 | Moto et al. | |

(Continued)

OTHER PUBLICATIONS

U.S. Appl. No. 12/396,017, filed Mar. 2, 2009, Okada.

(Continued)

*Primary Examiner* — Alexander O Williams
(74) *Attorney, Agent, or Firm* — Oblon, Spivak, McClelland, Maier & Neustadt, L.L.P.

(57) ABSTRACT

A semiconductor memory device includes: a wiring board including an element mounting portion and connection pads; a first element group including a plurality of semiconductor elements each having electrode pads arranged along one of outer sides of the semiconductor element, the plurality of semiconductor elements being layered stepwise on the element mounting portion of the wiring board in a way that pad arrangement sides of the semiconductor elements face in the same direction, and that the electrode pads are exposed; a second element group including a plurality of semiconductor elements each having electrode pads arranged along one of outer sides of the semiconductor element, the plurality of semiconductor elements being layered stepwise on the first element group in a way that pad arrangement sides of the semiconductor elements face in the same direction as that of the first element group, and that the electrode pads are exposed, the second element group being disposed to be offset from the first element group in an arrangement direction of the electrode pads;
metallic wires for electrically connecting the electrode pads of the plurality of semiconductor elements included in the first and second element groups to the connection pads of the wiring board; and a sealing resin layer formed on the wiring board so as to seal the first and second element groups together with the metallic wires.

18 Claims, 9 Drawing Sheets

U.S. PATENT DOCUMENTS

| | | | |
|---|---|---|---|
| 2007/0102801 A1* | 5/2007 | Ishida et al. | 257/686 |
| 2007/0194454 A1 | 8/2007 | Hanawa et al. | |
| 2007/0218588 A1* | 9/2007 | Takiar et al. | 438/109 |
| 2007/0270573 A1* | 11/2007 | Collins | 530/335 |
| 2008/0048301 A1* | 2/2008 | Wang et al. | 257/666 |
| 2008/0150111 A1* | 6/2008 | Hiller et al. | 257/686 |
| 2008/0290493 A1* | 11/2008 | Tsunozaki | 257/686 |
| 2009/0085223 A1* | 4/2009 | Nishiyama et al. | 257/777 |
| 2009/0096073 A1* | 4/2009 | Goto | 257/676 |
| 2009/0108470 A1* | 4/2009 | Okada et al. | 257/777 |
| 2009/0140440 A1* | 6/2009 | Liu et al. | 257/777 |
| 2009/0166839 A1* | 7/2009 | Suzuki et al. | 257/686 |
| 2009/0230528 A1* | 9/2009 | McElrea et al. | 257/676 |
| 2009/0236735 A1* | 9/2009 | Corisis et al. | 257/723 |
| 2009/0302441 A1* | 12/2009 | Fan | 257/666 |
| 2010/0314740 A1* | 12/2010 | Choi et al. | 257/686 |

OTHER PUBLICATIONS

U.S. Appl. No. 12/887,000, filed Sep. 21, 2010, Nishiyama.

U.S. Appl. No. 12/238,983, filed Sep. 26, 2008, Taku Nishiyama, et al.

U.S. Appl. No. 11/767,801, filed Jun. 25, 2007, Taku Nishiyama, et al.

* cited by examiner

SEMICONDUCTOR MEMORY DEVICE

CROSS REFERENCE TO RELATED APPLICATIONS

This application is based on and claims the benefit of priority from the prior Japanese Patent Application No. 2007-335665, filed on Dec. 27, 2007, and, Japanese Patent Application No. 2007-335666, filed on Dec. 27, 2007, the entire contents of which are incorporated herein by reference.

BACKGROUND OF THE INVENTION

1. Field of the Invention

The present invention relates to a semiconductor memory device.

2. Related Art

Memory cards (semiconductor memory cards) each having a built-in NAND-type flash memory and the like have been rapidly miniaturized and increased in capacity. To fabricate a miniaturized memory card, semiconductor elements such as a memory element and a controller element are mounted on a wiring board in a multi-layered fashion. Furthermore, to increase the capacity of the memory card, memory elements themselves are also multi-layered on the wiring board. By wire bonding, electrode pads of the semiconductor elements such as a memory element and a controller element are electrically connected to connection pads of the wiring board.

The number of layers of the memory elements has been on the increase. One possible technique has been proposed to bond wires to multi-layered semiconductor elements (memory elements) in a one-side pad structure, for example, in which the electrode pads are arranged at an end of one of the short sides of each of the semiconductor elements (e.g., refer to U.S. Pat. No. 7,061,105). In this technique, the multiple semiconductor elements are layered stepwise to expose the electrode pads. The exposed electrode pads are electrically connected to connection pads of a wiring board via bonding wires (metallic wires or the like).

SUMMARY OF THE INVENTION

An aspect of the present invention is a semiconductor memory device including: a wiring board including an element mounting portion and connection pads;

a first element group including multiple semiconductor elements each having electrode pads arranged along one of outer sides of the semiconductor element, the multiple semiconductor elements being layered stepwise on the element mounting portion of the wiring board in a way that pad arrangement sides of the semiconductor elements face in the same direction, and that the electrode pads are exposed;

a second element group including multiple semiconductor elements each having electrode pads arranged along one of outer sides of the semiconductor element, the multiple semiconductor elements being layered stepwise on the first element group in a way that pad arrangement sides of the semiconductor elements face in the same direction as that of the first element group, and that the electrode pads are exposed, the second element group being disposed to be offset from the first element group in an arrangement direction of the electrode pads;

metallic wires for electrically connecting the electrode pads of the multiple semiconductor elements included in the first and second element groups to the connection pads of the wiring board; and a sealing resin layer formed on the wiring board so as to seal the first and second element groups together with the metallic wires.

DETAILED DESCRIPTION OF THE INVENTION

Embodiments of the present invention will be described below with reference to the accompanying drawings.

First Embodiment

Figure 1:
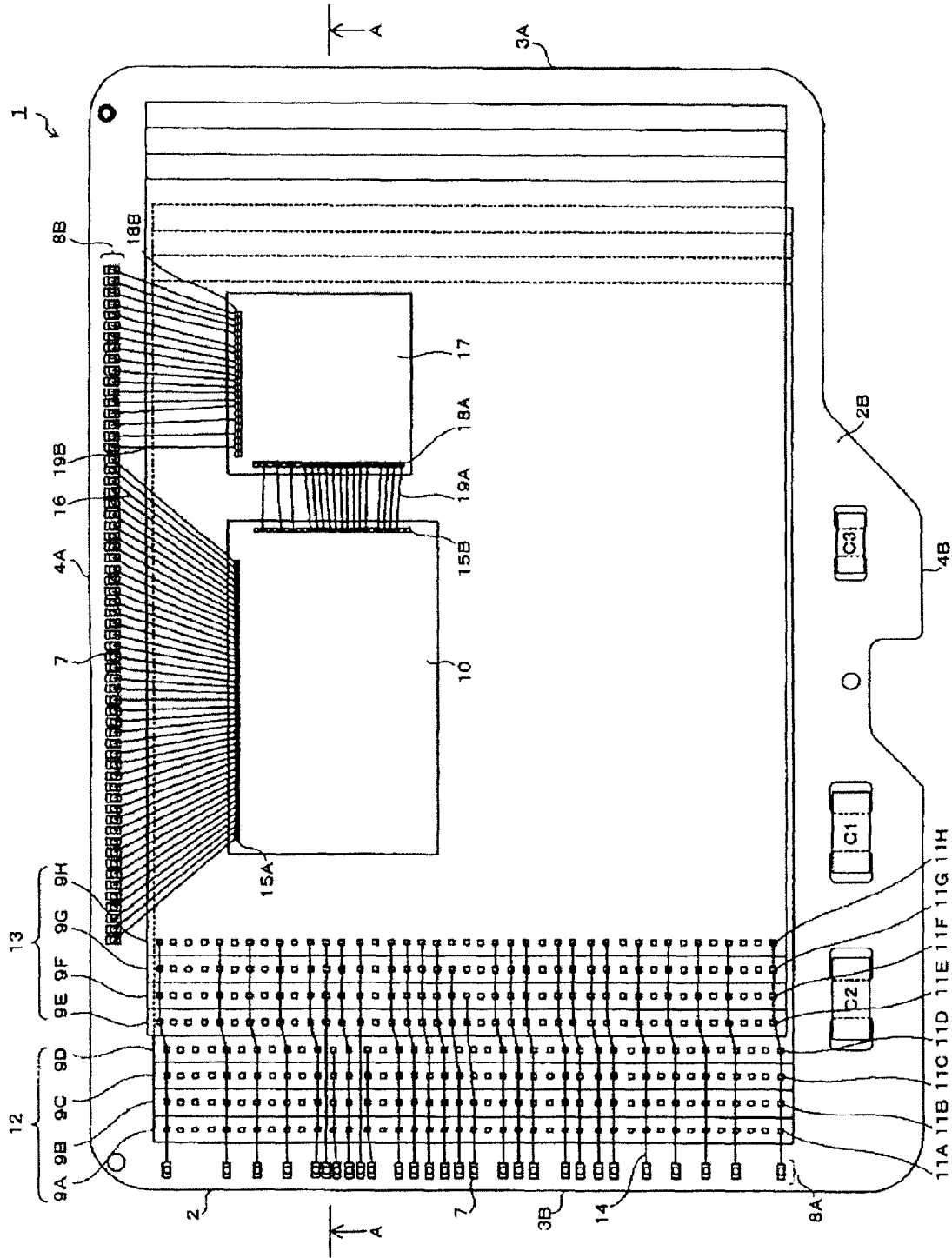
FIG. 1 is a plan view showing a semiconductor storage device according to a first embodiment of the present invention.
Figure 2:
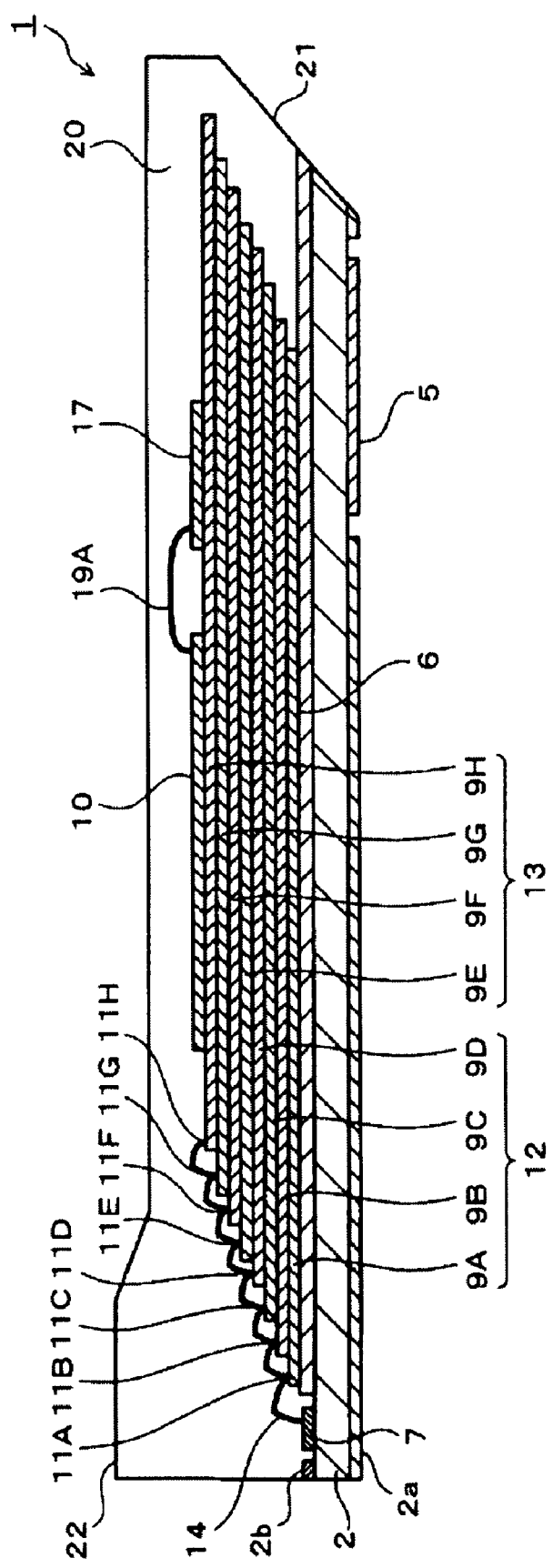
FIG. 2 is a sectional view taken along the line A-A of FIG. 1.

A mode for carrying out the present invention will be described below with reference to the drawings. FIGS. 1 and 2 are diagrams showing a configuration of a semiconductor storage device (a semiconductor memory device) according to a first embodiment of the present invention. FIG. 1 is a plan view showing the semiconductor storage device (semiconductor memory device); and FIG. 2 is a sectional view taken along the line A-A thereof (a sectional view cut in the direction of a long side thereof). A semiconductor storage device 1 shown in these drawings constitutes a semiconductor memory card. The device 1 is used alone as a memory card that meets microSD (trademark) standard. The semiconductor storage device 1 is a caseless memory card.

The semiconductor storage device 1 includes a wiring board 2 which serves as an element mounting substrate and also as a terminal formation substrate. The wiring board 2 is for example an insulating resin substrate having wiring network in the inside and a surface thereof. To be more specific, a printed circuit board with a glass epoxy resin, BT resin (bismaleimide triazine resin), or the like is adopted as the wiring board 2. The wiring board 2 includes a first principal surface 2a serving as a terminal formation surface, and a second principal surface 2b serving as an element mounting surface. On the second principal surface 2b of the wiring board 2, first to third chip capacitors C1 to C3 are mounted.

The outer shape of the wiring board 2 is substantially rectangular. One short side 3A of the wiring board 2 corresponds to a front edge portion of the memory card at the time of insertion into a card slot. The other short side 3B corresponds to a rear portion of the memory card. One long side 4A of the wiring board 2 has a straight shape, while the other long side 4B thereof has a notch portion and a constricted portion indicative of the front/rear of and the top side/bottom side of the memory card. Furthermore, each corner of the wiring board 2 has a round shape (an R shape).

On the first principal surface 2a of the wiring board 2, an external connection terminal 5 serving as an input-output terminal of the memory card is formed. The external connection terminal 5 is constituted of a metallic layer which is formed by electrolytic plating or the like. Furthermore, the first principal surface 2a of the wiring board 2 corresponds to the top surface of the memory card. In addition, on the first principal surface 2a of the wiring board 2, a first wiring network (not shown) is provided to an area excluding a formation area of the external connection terminal 5. The first wiring network includes, for example, a test pad of the memory card. The first wiring network provided to the first principal surface 2a is covered with an insulating layer (not shown) using an insulating adhesive seal, an insulating adhesive tape, or the like.

The second principal surface 2b of the wiring board 2 is provided with an element mounting portion 6 and a second wiring network including connection pads 7 which each serve as bonding portions at the time of wire bonding. The second principal surface 2b of the wiring board 2 corresponds to the bottom surface of the memory card. The second wiring network including the connection pads 7 is electrically connected to the external connection terminal 5 and the first wiring network via an internal wiring (a through-hole or the like), omitted in the drawing, of the wiring board 2. The connection pads 7 are disposed on a first pad area 8A placed along the short side 3B, and on a second pad area 8B placed along the long side 4A.

On the element mounting portion 6 of the wiring board 2, multiple memory elements (semiconductor elements) 9 are mounted in a layered fashion. As the memory element 9, a semiconductor memory element such as a NAND-type flash memory is used. On top of the memory elements 9, a controller element (semiconductor element) 10 is stacked. The controller element 10 selects (i.e., performs chip selection), from the multiple memory elements 9, a memory element on which writing of data or reading of data is performed. The controller element 10 then writes data into the memory element 9 thus selected, reads stored data therefrom, or performs a similar operation thereon.

On the second principal surface 2b of the wiring board 2, a first memory element 9A, a second memory element 9B, a third memory element 9C, a fourth memory element 9D, a fifth memory element 9E, a sixth memory element 9F, a seventh memory element 9G, and an eighth memory element 9H are stacked in sequence. The first to eighth memory elements 9A to 9H have the same rectangular shape, and include electrode pads 11A to 11H, respectively. The first to eighth electrode pads 11A to 11H are arranged along an outer side, specifically, one short side, of the respective first to eighth memory elements 9A to 9H. The first to eighth memory elements 9A to 9H each have a structure with pads on one short side.

The first memory element 9A is adhered onto the element mounting portion 6 of the wiring board 2 with an adhesive layer interposed therebetween, so that an electrode formation surface of the first memory element 9A, on which the first electrode pads 11A are formed, faces upward. For the adhesive layer, a die attach film (adhesive film) containing mainly generally-used polyimide resin, epoxy resin, acrylic resin, and the like is adopted. The same film is adopted for adhesive layers for the other memory elements 9. The first memory element 9A is disposed so that a pad arrangement side (one short side) can face to the short side 3B of the wiring board 2. In other words, the first memory element 9A is disposed so that the electrode pads 11A can be located in the vicinity of the first pad area 8A of the wiring board 2.

The second memory element 9B is adhered onto the first memory element 9A with such an adhesive layer interposed therebetween, so that, while the first electrode pads 11A are exposed, an electrode formation surface of the second memory element 9B, on which the second electrode pads 11B are formed, faces upward. Similarly, the third memory element 9C is adhered onto the second memory element 9B, and the fourth to eighth memory elements 9D to 9H are respectively adhered onto the lower memory elements 9C to 9G, with an adhesive layer interposed between each upper device and lower device. The second to eighth memory elements 9B to 9H are layered stepwise so that each pad arrangement side can face in the same direction as that of the first memory element 9A, and that the electrode pads 11 of a lower memory element 9 can be exposed.

In this manner, the first to eighth memory elements 9A to 9H are layered stepwise in sequence so that the pad arrangement sides (one short sides) thereof can face in the same direction, and that the short sides (pad arrangement sides) can be offset from one another in the direction of a long side so as to expose the electrode pads 11 of the lower memory elements 9. According to the layer state of the stepwise structure of the first to eighth memory elements 9A to 9H, all of the first to eighth electrode pads 11A to 11H are exposed so as to face upward, in which state these electrode pads are located in the vicinity of the first pad area 8A.

On the basis of a control signal for an element selection from the controller element 10, the first to eighth memory element 9A to 9H are classified into a first memory element group 12 and a second memory element group 13. The first memory element group 12 includes the first to fourth memory elements 9A to 9D. The second memory element group 13 includes the fifth to eighth memory elements 9E to 9H. The first to fourth memory elements 9A to 9D included in the first memory element group 12 are layered stepwise so that the pad arrangement sides thereof can face in the same direction, that long sides can be aligned with one another, and that short sides can be offset from one another in the direction of the long sides so as to expose the electrode pads 11 of the lower memory elements 9.

Similarly, the fifth to eighth memory elements 9E to 9H included in the second memory element group 13 are layered stepwise so that the pad arrangement sides thereof can face in the same direction, that long sides can be aligned with one another, and that short sides can be offset from one another in the direction of the long sides so as to expose the electrode pads 11 of the lower memory elements 9. However, the second memory element group 13 is disposed to be offset from the first memory element group 12 in an arrangement direction of the electrode pads 11. Specifically, the second memory element group 13 is disposed in a way that each set of four electrode pads 11E to 11H of the fifth to eighth memory elements 9E to 9H included in the second memory element group 13 is positioned between two neighboring sets of four electrode pads 11A to 11D of the first to fourth memory elements 9A to 9D included in the first memory element group 12, when viewed from the short side 3B.

For example, when the electrode pads 11 are disposed at an interval of 226 μm, the second memory element group 13 is disposed to be offset from the first memory element group 12 by, for example, a distance (113 μm) that is half of the pad interval (226 μm) in the arrangement direction of the electrode pads 11. FIG. 1 shows a state where the second memory element group 13 is disposed to be offset toward the long side 4A. By disposing the second memory element group 13 offset from the first memory element group 12 in the arrangement direction of the electrode pads 11, the set of the fifth to eighth electrode pads 11E to 11H is positioned between the two sets of the first to fourth electrode pads 11A to 11D, when viewed from the short side 3B.

In this manner, the first to fourth memory elements 9A to 9D included in the first memory element group 12 are layered stepwise on the element mounting portion 6 so that the pad arrangement sides thereof can face in the same direction, that long sides can be aligned with one another, and that the electrode pads 11 of the lower memory elements 9 can be exposed. The fifth to eighth memory elements 9E to 9H included in the second memory element group 13 are layered stepwise on the first memory element group 12 so that the pad arrangement sides thereof can face in the same direction as those of the first memory element group 12, that long sides can be aligned with one another, and that the electrode pads 11 of the lower memory elements 9 can be exposed. The second memory element group 13 is disposed to be offset from the first memory element group 12 in the arrangement direction of the electrode pads 11.

Figure 3:
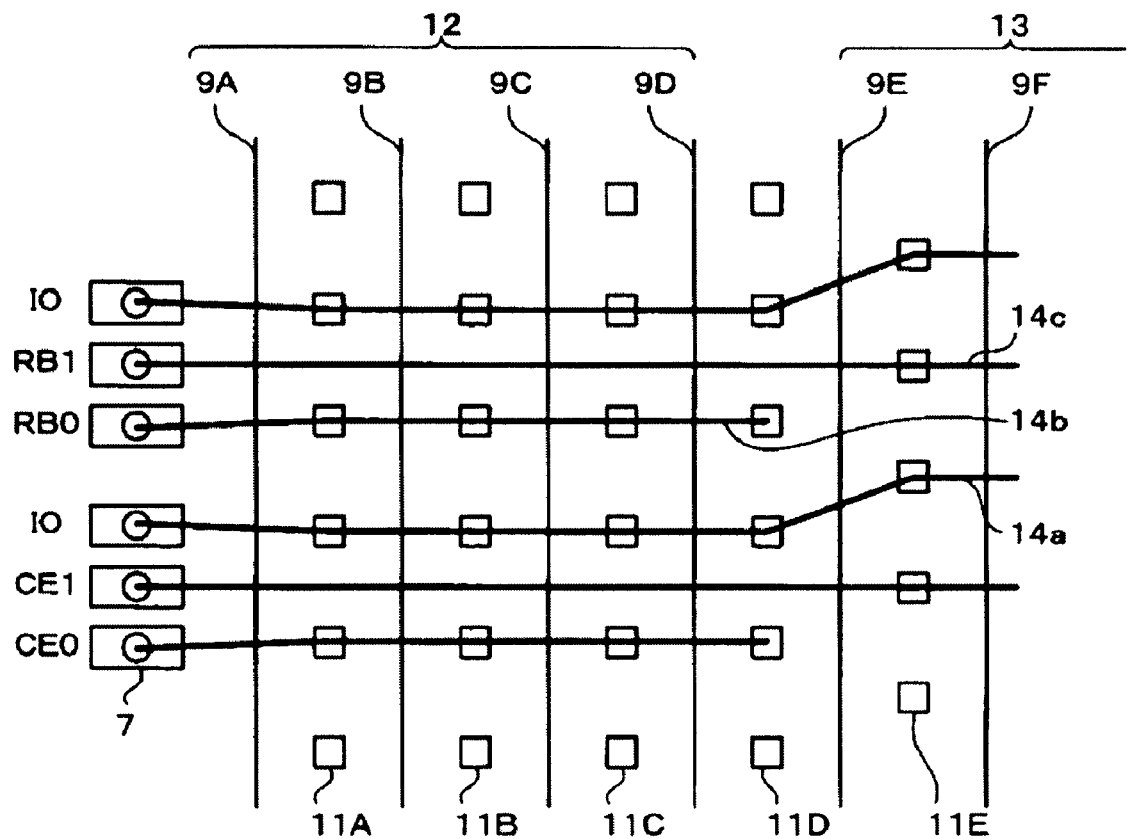
FIG. 3 is a diagram showing a connection state, with metallic wires, between first and second memory element groups and a wiring board included in the semiconductor storage device shown in FIG. 1.
Figure 4:
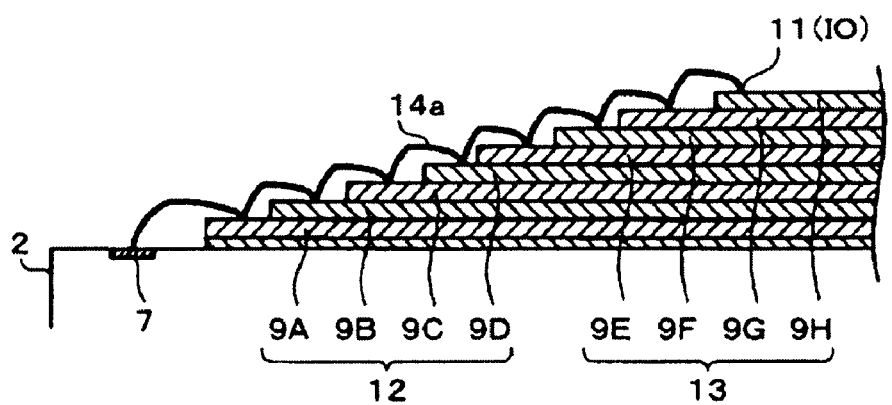
FIG. 4 is a diagram showing a connection state, with metallic wires for data signal, between the first and second memory element groups and the wiring board included in the semiconductor storage device shown in FIG. 1.

The electrode pads 11A to 11H of the first to eighth memory elements 9A to 9H are electrically connected to the connection pads 7 with metallic wires 14, the connection pads 7 being disposed on the first pad area 8A. Of the electrode pads 11 of the first to eighth memory elements 9A to 9H, some of the first to eighth electrode pads 11A to 11H are connected in sequence to a data signal terminal (I/O) or the like, as shown in FIGS. 3 and 4, with a data signal metallic wire 14a. In this manner, when electric characteristics, signal characteristics, and the like, of the electrode pads 11 are the same, the electrode pads 11A to 11H of all the memory elements 9A to 9H can be connected to each other in sequence with the first metallic wires 14. Then, these electrode pads 11A to 11H can be connected to the connection pads 7 of the wiring board 2 with the metallic wires 14.

Figure 5:
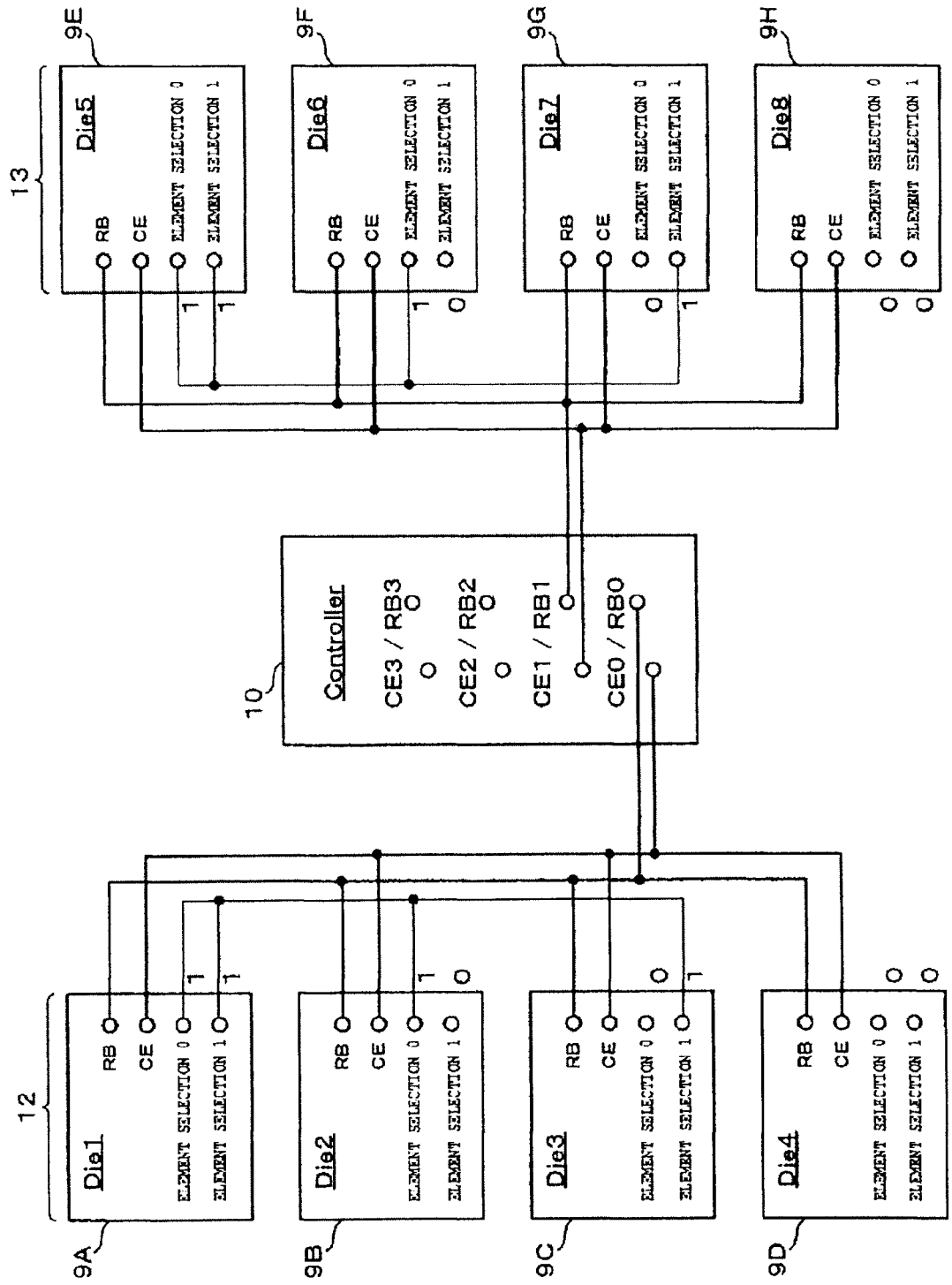
FIG. 5 is a diagram showing an element selection structure of the semiconductor storage device shown in FIG. 1.

On the other hand, for electrode pads for control signal such as an element selection (CE (Chip enable), RB (Ready/Busy), element selection, and the like), the first memory element group 12 and the second memory element group 13 need to be separately connected to connection pads 7 of the wiring board 2 electrically. FIG. 5 shows an element selection structure of the semiconductor storage device 1. As shown in FIG. 5, an element selection is controlled separately on the first memory element group 12 and the second memory element group 13. For the first memory element group 12, the element selection is made by checking the conducting states of element selection 0 terminals and element selection 1 terminals of the first to fourth memory elements 9A to 9D. The same element selection is made for the second memory element group 13 by checking the conducting states of element selection 0 terminals and element selection 1 terminals of the fifth to eighth memory elements 9E to 9H.

Figure 6:
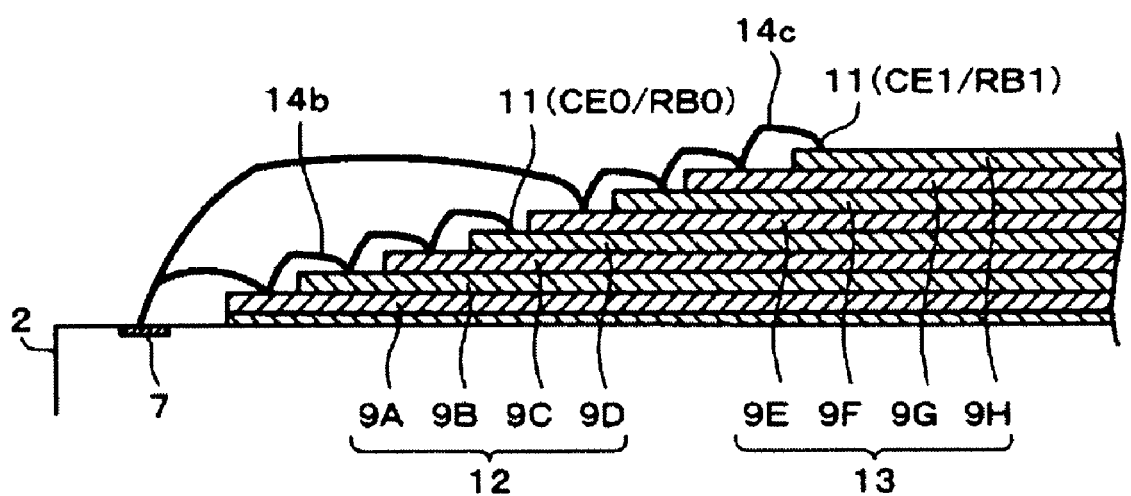
FIG. 6 is a diagram showing a connection state, with metallic wires for control signal, between the first and second memory element groups and the wiring board included in the semiconductor storage device shown in FIG. 1.

Of the electrode pads 11 of the first to fourth memory elements 9A to 9D included in the first memory element group 12, the first to fourth electrode pads 11A to 11D are connected to each other in sequence and to a CE terminal and an RB terminal with first control signal metallic wires 14b as shown in FIGS. 3 and 6. Then, the first electrode pad 11A is connected to the connection pad 7 with the first control signal metallic wire 14b. This is similar in the case of the second memory element group 13; a CE terminal and an RB terminal are connected to the fifth to eighth electrode pads 11E to 11H in sequence with second control signal metallic wires 14c. Then, the fifth electrode pad 11E is connected to the connection pad 7 with the second control signal metallic wire 14c.

For the first control signal metallic wire 14b, since the connection pad 7 and the electrode pad 11A of the first memory element 9A located in the vicinity of the connection pad 7 are connected to each other, usual wire bonding does not create any problem. Meanwhile, for the second control signal metallic wire 14c, the connection pad 7 and the electrode pad 11E of the fifth memory element 9E need to be connected to each other by skipping the electrode pads 11A to 11D of the first to fourth memory elements 9A to 9D. Therefore, depending on a layer structure of the memory element 9, the second control signal metallic wire 14c may come into contact with first control signal metallic wire 14b which is placed below the second control signal metallic wire 14c.

For example, when the first to eighth memory elements 9A to 9H are simply layered stepwise with the long sides aligned with one another, the wiring of the second control signal metallic wire 14c is made over the first control signal metallic wire 14b, so that these wires tend to come into contact with each other. Furthermore, even if the second control signal metallic wire 14c has a larger entering angle, when, for example, eight or more of the memory elements 9 are layered stepwise, a contact between the second control signal metallic wire 14c and the first control signal metallic wire 14b may not be avoidable since the entering angle has a limitation.

For this point, in this embodiment, the second memory element group 13 is disposed to be offset from the first memory element group 12, and thereby the set of the fifth to eighth electrode pads 11E to 11H is disposed between the two sets of the first to fourth electrode pads 11A to 11D, when viewed from the short side 3B. Therefore, as shown in FIG. 3, the wiring of the second control signal metallic wire 14c is made possible between every two of the first to fourth electrode pads 11A to 11D without increasing the entering angle. Accordingly, when the second control signal metallic wire 14c is connected to the second memory element group 13, the contact with the first control signal metallic wire 14b can be restrained.

As described above, in the semiconductor storage device 1 of this embodiment, the second memory element group 13 is disposed to be offset from the first memory element group 12, so that the set of the fifth to eighth electrode pads 11E to 11H is at a position between the two neighboring sets of the first to fourth electrode pads 11A to 11D. Thus, it becomes possible to prevent the first control signal metallic wire 14b connected to the first memory element group 12 from coming into contact with the second control signal metallic wire 14c connected to the second memory element group 13. Therefore, for example, when eight or more the memory elements 9 are layered, it is possible to restrain an occurrence of a failure due to a contact between the metallic wires 14b and 14c.

Onto the second memory element group 13 (the eighth memory element 9H to be more specific), the controller element 10 is adhered with the adhesive layer interposed therebetween. The controller element 10 has an L-shape pad structure with electrode pads 15A and 15B arranged along a first outer side and a second outer side perpendicular thereto, respectively. Of these electrode pads 15A and 15B, the electrode pads 15A located in the vicinity of the second pad area 8B (the electrode pads 15A arranged along the first outer side parallel to the long side 4A of the wiring board 2) are electrically connected to the connection pads 7 disposed on the second pad area 8B with second metallic wires 16.

Incidentally, since the first to eighth memory elements 9A to 9H are layered stepwise in sequence, the length of the layer structure of the memory elements 9 becomes large in the stepwise direction. Accordingly, an occupied area of the memory elements 9 (a projected area of all the elements) relative to the area of the wiring board 2 is increased, so that a pad disposition region along the short side of the wiring board 2 is restricted. Since the size of the semiconductor memory card is defined, it is impossible in this embodiment to set a pad area for the controller element 10 in an area along the short side 3B of the wiring board 2. Since the controller element 10 has the L-shape pad structure, use of only the second pad area 8B provided along the long side 4A of the wiring board 2 does not enable the direct wire boding of all the electrode pads 15 with the connection pads 7.

In the semiconductor storage device 1 of this embodiment, a relay element 17 is disposed on the second memory element group 13 and in parallel to the controller element 10. The relay element 17 is adhered onto the eighth memory element 9H with the adhesive layer interposed therebetween as in the cases of the other elements. The relay element 17 has electrode pads (relay pads) 18A and 18B arranged respectively along one outer side and another outer side perpendicular thereto. The relay element 17 is disposed so that the electrode pads 18A can face the electrode pads 15B of the controller element 10, and that the electrode pads 18B can be disposed in the vicinity of the second pad area 8B. The relay element 17 has the same structure as that of a usual semiconductor memory device.

The electrode pads 15B (electrode pads arranged along the second outer side perpendicular to the long side 4A of the wiring board 2) of the controller element 10 are electrically connected to the electrode pads 18A of the relay element 17 with third metallic wires (first relay metallic wires) 19A. Furthermore, the electrode pads 18B of the relay element 17 are electrically connected to the connection pads 7 disposed on the second pad area 8B with third metallic wires (second relay metallic wires) 19B. The relay element 17 has a wiring layer connecting the electrode pads 18A to the electrode pads 18B. The electrode pads 15B of the controller element 10 and the connection pads 7 disposed on the second pad area 8B are electrically connected to each other with the third metallic wires 19 via the relay element 17.

Incidentally, while the relay element 17 has been used hereinabove, connections between the electrode pads 15 of the controller element 10 and the connection pads 7 of the wiring board 2 are not limited to this. For example, when the pad area 8A of the wiring board 2 has enough space, electrode pads 15B (in this case, the electrode pads 15B being arranged along the outer side on the side of the pad area 8A) of the controller element 10 can be connected to the connection pads 7 with the second metallic wires 16.

On the second principal surface 2b, of the wiring board 2, on which the memory elements 9 and the controller element 10 are mounted, a sealing resin layer 20 formed of, for example, an epoxy resin is molded. The memory elements 9 and the controller element 10 together with the metallic wires 14, 16, 19, and the like are integrally sealed with the sealing resin layer 20. At a front end of the sealing resin layer 20, an inclining portion 21 indicative of the front of the memory card is provided. At the rear of the sealing resin layer 20, a grip portion 22 that is a partly risen sealing resin is provided. On the basis of the above, the semiconductor storage device 1 to be used as a semiconductor memory card is configured. The sealing resin layer 20 is omitted in FIG. 1.

Note that the first to eighth memory elements 9A to 9H included in the first and second memory element groups 12 and 13 are layered stepwise so as to expose the electrode pads 11A to 11H. Consequently, the memory elements 9 are in sequence protruded layer by layer in an eaves-like fashion on the short side opposite to the short side on which the electrode pads 11 are arranged. The eaves-like portion of a layered body formed of the memory elements 9 inclines in the same direction as that of the inclining portion 21 provided to the front end of the sealing resin layer 20. The layered body formed of the memory elements 9 is disposed so that part of the eaves-like portion overlaps the inclining portion 21 of the sealing resin layer 20. This makes it possible to cope with an increase of the number of memory elements housed in the sealing resin layer 20.

The semiconductor storage device 1 is a device which alone constitutes a semiconductor memory card (e.g., a microSD (trademark) card) without a housing case such as a base card. Therefore, the sealing resin layer 20 and the like are directly exposed to the outside. In other words, the semiconductor storage device 1 is a caseless semiconductor memory card having the sealing resin layer 20 and the like being exposed to the outside. Accordingly, the notch portion and the constricted portion indicative of the front/rear of and the top side/bottom side of the memory card described above as well as the inclining portion 21 are directly provided to the semiconductor storage device 1.

The thicknesses of the first to eighth memory elements 9A to 9H are set preferably in the range of 10 to 50 µm, excluding the first memory element 9A located at the lowest level. The thickness of the first memory element 9A is preferably set in the range of 50 to 150 µm in order to restrain the occurrence of a fracture, a crack, or the like due to surface roughness of the wiring board 2. For example, suppose a case where the thickness of the wiring board 2 is set to 125 µm, that of the first memory element 9A to 60 µm, that of the adhesive layer thereof to 20 µm, that of each of the second to eighth memory elements 9B to 9H to 40 µm, that of each adhesive layer thereof to 5 µm, that of the controller element 10 to 40 µm, that of the adhesive layer thereof to 5 µm, and that of resin over the elements of the sealing resin layer 20 to 135 µm. In this case, the total thickness becomes 700 µm. This can satisfy a card thickness (in the range of 700 to 740 µm) required for, for example, a microSD (trademark) card.

For the semiconductor storage device 1 of this embodiment, the number of memory elements 9 to be mounted (the number of layers) is not limited to eight, as long as each of the first and second memory element groups 12 and 13 is constituted by a number of the memory elements 9. However, in order to increase the capacity of the semiconductor storage device 1, it is preferable that the number of memory elements 9 be eight or more. For example, when eight memory elements 9 each having a storage capacity of 1 GB are used, it becomes possible to achieve an 8-GB microSD (trademark) card with a semiconductor storage device 1. Furthermore, it is only necessary that the layer structure of the memory elements 9 be formed by layering stepwise the memory elements 9 constituting each element group; alternatively, for example, each element group may be formed into a layer structure having at least two levels of the memory elements with spacers interposed therebetween.

Second Embodiment

Figure 7:
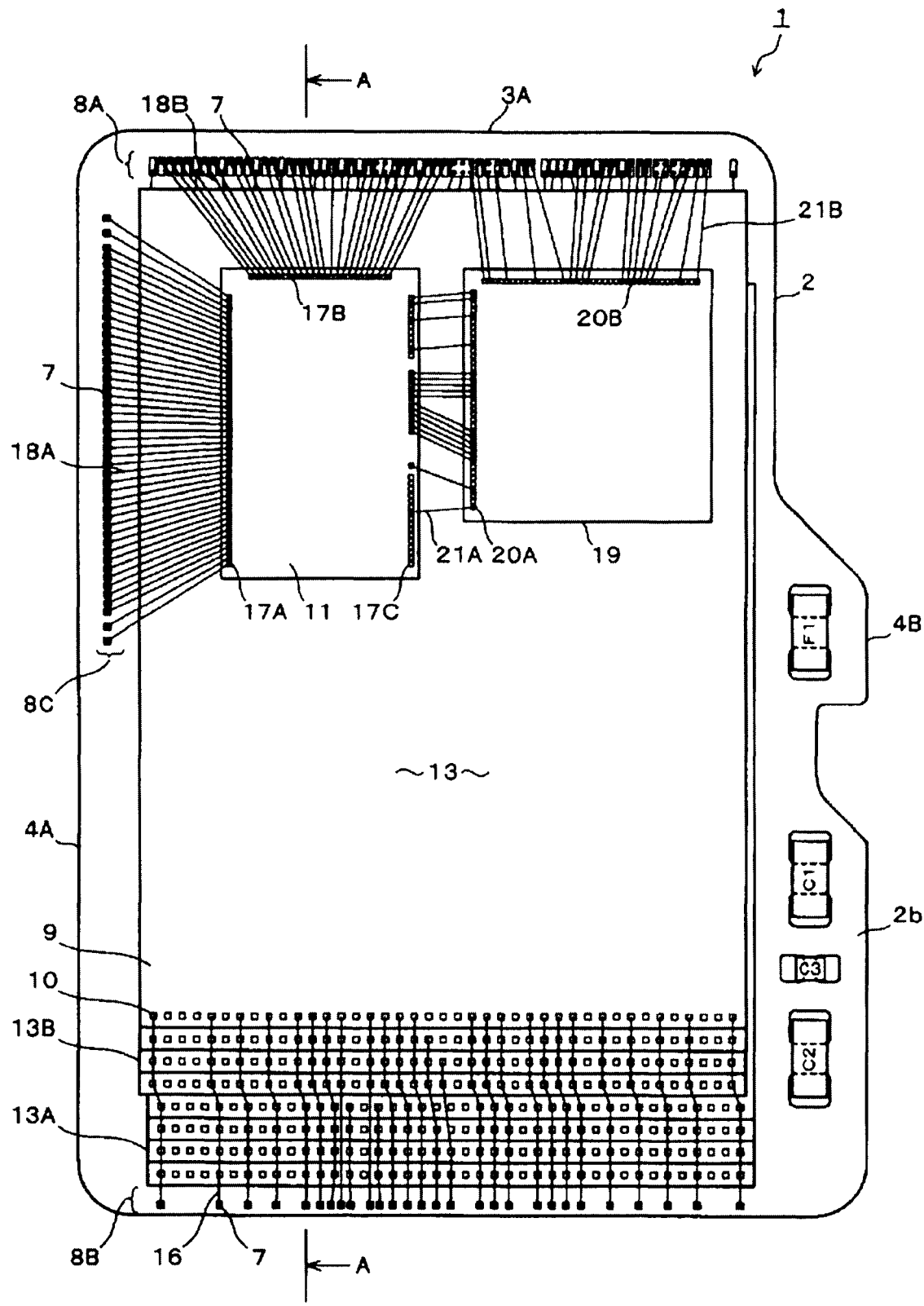
FIG. 7 is a plan view showing a semiconductor storage device according to a second embodiment of the present invention.
Figure 8:
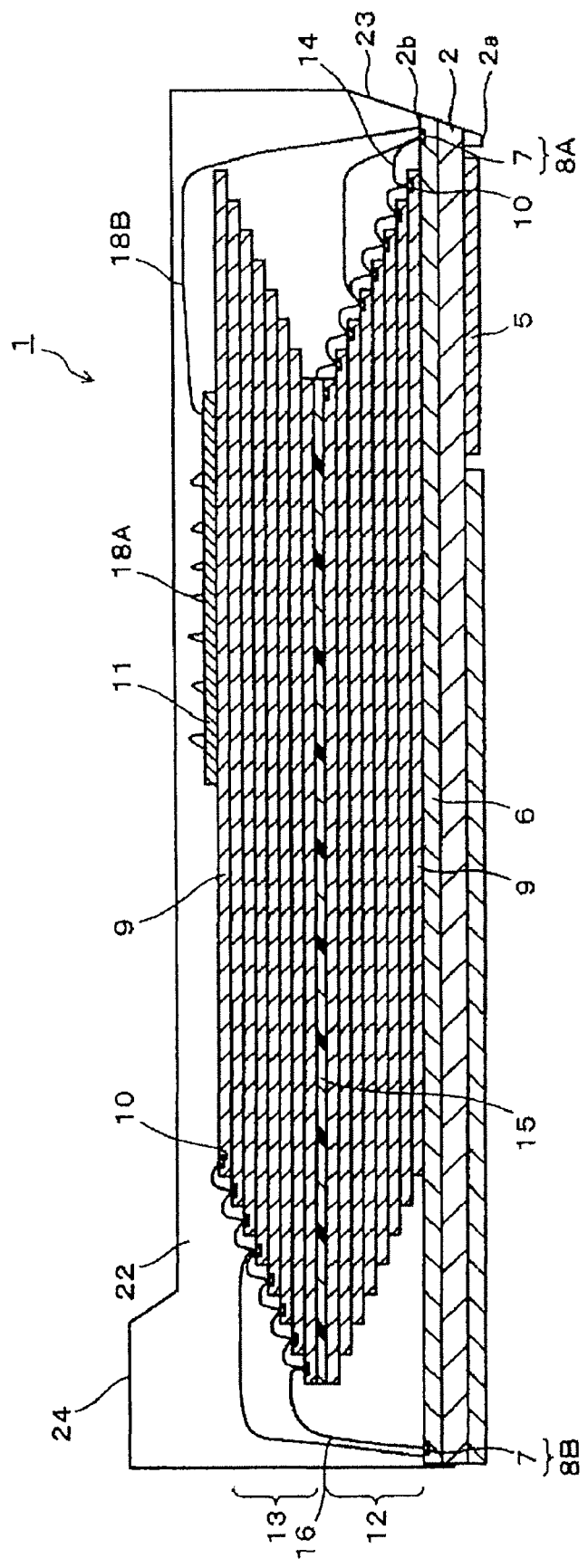
FIG. 8 is a sectional view taken along the line A-A of FIG. 7.

A second embodiment for carrying out the present invention will be described below with reference to the drawings. Symbols used in this embodiment are different from those used in the first embodiment. FIGS. 7 and 8 are diagrams showing a configuration of a semiconductor storage device (semiconductor memory device) according to this embodiment of the present invention. FIG. 7 is a plan view of the semiconductor storage device (semiconductor memory device); and FIG. 8 is a sectional view taken along the line A-A thereof (a sectional view cut in the direction of a long side thereof). A semiconductor storage device (semiconductor memory device) 1 shown in these drawings constitutes a semiconductor memory card. In other words, the semiconductor storage device 1 is used as a caseless semiconductor memory card (e.g., a memory card that meets microSD (trademark) standard).

The semiconductor storage device 1 includes a wiring board 2 which serves as an element mounting substrate and also as a terminal formation substrate. The wiring board 2 is for example an insulating resin substrate having wiring network in the inside and a surface thereof. To be more specific, a printed circuit board with a glass epoxy resin, BT resin (bismaleimide triazine resin), or the like is adopted as the wiring board 2. The wiring board 2 includes a first principal surface 2a serving as a terminal formation surface, and a second principal surface 2b serving as an element mounting surface. On the second principal surface 2b of the wiring board 2, first to third chip capacitors C1 to C3, fuse F1, and the like are mounted.

The outer shape of the wiring board 2 is substantially rectangular. One short side 3A of the wiring board 2 corresponds to a front edge portion of the memory card at the time of insertion into a card slot. The other short side 3B corresponds to a rear portion of the memory card. One long side 4A of the wiring board 2 has a straight shape, while the other long side 4B thereof has a notch portion and a constricted portion indicative of the front/rear of and the top side/bottom side of the memory card. Furthermore, each corner of the wiring board 2 has a round shape (an R shape).

On the first principal surface 2a of the wiring board 2, an external connection terminal 5 serving as an input-output terminal of the memory card is formed. The external connection terminal 5 is constituted of a metallic layer which is formed by electrolytic plating or the like. Furthermore, the first principal surface 2a of the wiring board 2 corresponds to the top surface of the memory card. In addition, on the first principal surface 2a of the wiring board 2, a first wiring network (not shown) is provided to an area excluding a formation area of the external connection terminal 5. The first wiring network includes, for example, a test pad of the memory card. The first wiring network provided to the first principal surface 2a is covered with an insulating layer (not shown) using an insulating adhesive seal, an insulating adhesive tape, or the like.

The second principal surface 2b of the wiring board 2 is provided with an element mounting portion 6 and a second wiring network including connection pads 7. The second principal surface 2b of the wiring board 2 corresponds to the bottom surface of the memory card. The second wiring network including the connection pads 7 is electrically connected to the external connection terminal 5 and the first wiring network via an internal wiring (a through-hole or the like), omitted in the drawing, of the wiring board 2. The connection pads 7 are disposed on a first pad area 8A placed along the short side 3A, on a second pad area 8B placed along the short side 3B, and on a third pad area 8C placed along the long side 4A.

On the element mounting portion 6 of the wiring board 2, multiple memory elements (semiconductor elements) 9 are mounted. As the memory element 9, a semiconductor memory element such as an NAND-type flash memory is used. The multiple memory elements 9 have the same rectangular shape, and each include electrode pads 10. The electrode pads 10 are arranged along an outer side, specifically, one short side, of each memory element 9. The memory element 9 has a structure with pads on one short side. On the memory element 9, a controller element (semiconductor element) 11 is stacked. The controller element 11 selects, from the multiple memory elements 9, a memory element on which writing of data or reading of data is performed. The controller element 10 then writes data into the memory element 9 thus selected, reads stored data therefrom, or performs a similar operation thereon.

The multiple memory elements 9 are classified into a first memory element group (semiconductor element group) 12 and a second memory element group 13. These memory element groups 12 and 13 are layered on the second principal surface 2b of the wiring board 2. The memory element groups 12 and 13 each include eight of the memory elements 9. The eight memory elements 9 included in the first memory element group 12 are layered stepwise in sequence on the element mounting portion 6 of the wiring board 2. The eight memory elements 9 included in the second memory element group 13 are layered stepwise in sequence on the first memory element group 12. The stepped pattern (i.e., a direction toward an upper level of the memory elements 9 layered stepwise) of the second memory element group 13 is opposite to the stepped pattern of the first memory element group 12.

Of the eight memory elements 9 included in the first memory element group 12, the memory element 9 at the lowermost level (first level) is adhered onto the element mounting portion 6 of the wiring board 2 with an adhesive layer (not shown) interposed therebetween, so that an electrode formation surface of the lowermost memory element 9 faces upward, the electrode formation surface having the electrode pads 10 of the lowermost memory element 9 thereon. For the adhesive layer, a die attach film (adhesive film) containing mainly generally-used polyimide resin, epoxy resin, acrylic resin, and the like is adopted. The same film is adopted for adhesive layers for the other memory elements 9 included in the first memory element group 12. The memory element 9 at the first level is disposed so that a pad arrangement side thereof can face to the short side 3A of the wiring board 2. In other words, the memory element 9 is disposed so that the electrode pads 10 can be located in the vicinity of the first pad area 8A of the wiring board 2.

The memory element 9 at a second level is adhered onto the memory element 9 at the first level with an adhesive layer (not shown) interposed therebetween, so that, while the electrode pads 10 of the memory element 9 at the first level are exposed, an electrode formation surface of the second-level memory element 9 faces upward, the electrode formation surface having the electrode pads 10 of the second-level memory element 9 thereon. Similarly, the remaining six memory elements (memory elements at the third to eighth levels) 9 are adhered onto the second-level memory element 9 and each other in sequence with the respective adhesive layers (not shown)

interposed between every two memory elements so that the short sides of the memory elements 9 can be offset from one another in the direction of a long side so as to expose the electrode pads 10 of the lower memory elements 9. In this manner, the eight memory elements (the memory elements at the first to eighth levels) 9 included in the first memory element group 12 are layered stepwise so that the pad arrangement sides thereof can face in the same direction (direction toward the short side 3A) and that the short sides can be offset from one another in the long side so as to expose the electrode pads 10 of the memory elements 9 at the lower levels.

Since the first memory element group 12 has such a stepwise layer structure, the electrode pads 10 of each memory element 9 included in the first memory element group 12 are located in the vicinity of the first pad area 8A, while being exposed upward. The electrode pads 10 of the eight memory elements 9 included in the first memory element group 12 are electrically connected to the connection pads 7 with first metallic wires (Au wires or the like) 14, the connection pads 7 being disposed on the first pad area 8A. When electric characteristics, signal characteristics, and the like, of each electrode pads 10 are the same, the electrode pads can be connected in sequence with the first metallic wires 14. Wire bonding between the two electrode pads 10 may be individually performed, or the pads may be connected to each other with a single piece of metallic wire in sequence.

Of the eight memory elements 9 included in the second memory element group 13, the memory element 9 at the lowermost level (ninth level) is adhered right onto the memory element 9 at the uppermost level (eighth level) in the first memory element group 12 with an insulating adhesive layer 15, serving as a spacer layer, interposed therebetween, so that an electrode formation surface of the ninth-level memory element 9 faces upward, the electrode formation surface having the electrode pads 10 of the ninth-level memory element 9 thereon. The memory element 9 at the lowermost level (ninth level) in the second memory element group 13 is layered on the memory element 9 at the uppermost level (eighth level) in the first memory element group 12 so that their short sides and their long sides can overlap each other, respectively. Therefore, the electrode pads 10 of the memory element 9 at the eighth level have no exposed part on the surface, since these electrode pads 10 are covered with the memory element 9 at the ninth level.

Thus, the memory element 9 at the ninth level is adhered onto the memory element 9 at the eighth level with the insulating adhesive layer 15, serving as the spacer layer, interposed therebetween. At least part of the insulating adhesive layer 15 is caused to soften or melt due to heat at the time of adhering. While incorporating an edge portion (an element-side edge portion) of the first metallic wire 14 connected to the memory element 9 at the eighth level being taken into the softened or melted part thereof, the insulating adhesive layer 15 adheres the memory element 9 at the eighth level to the memory element 9 at the ninth level. To achieve the above, an adhesive agent made from an insulating resin is used as the insulating adhesive layer 15 in order to secure the insulation of the first metallic wire 14.

Figure 9:
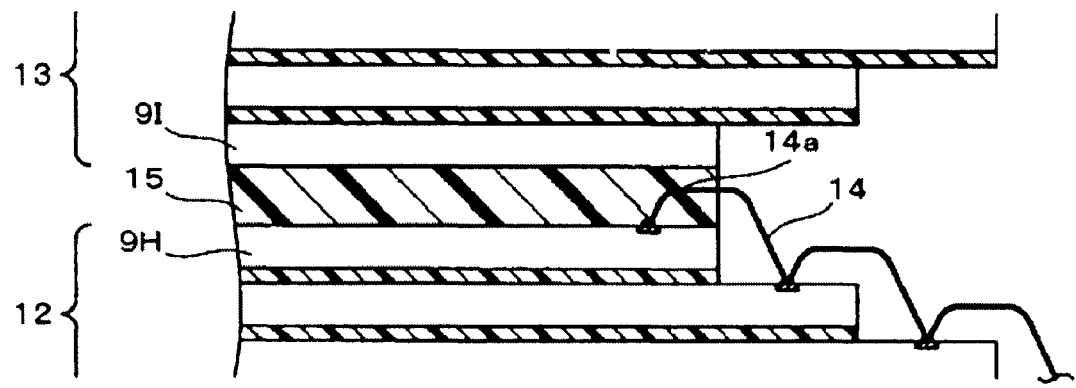
FIG. 9 is an enlarged sectional view showing part of the semiconductor storage device of FIG. 7.

As shown in FIG. 9, the element-side edge portion of the first metallic wire 14 connected to a memory element 9H at the uppermost level (eighth level) in the first memory element group 12 is embedded into the insulating adhesive layer 15. Thereby, the element-side edge portion of the first metallic wire 14 is prevented from coming into contact with a memory element 9I at the lowermost level (ninth level) in the second memory element group 13. The insulating adhesive layer 15 is formed on the bottom surface of the memory element 9I at the ninth level, and adhered to the memory element 9H at the eighth level so as to incorporate the element-side edge portion of the first metallic wire 14. The insulating adhesive layer 15 is formed, for example, of thermoplastic resin composition such as an acrylic resin, or of thermosetting resin composition such as an epoxy resin.

In this manner, the insulating adhesive layer 15 has a function serving as the spacer layer in addition to a function serving as the adhesive layer. The first metallic wire 14 connected to the memory element 9H at the eighth level is separated away from a lower surface of the memory element 9I at the ninth level in accordance with the thickness of the insulating adhesive layer 15. To acquire such a function as the spacer layer, the thickness of the insulating adhesive layer 15 is preferably 40 μm or more. When the thickness of the insulating adhesive layer 15 is less than 40 μm, the first metallic wire 14 may come into contact with the lower surface of the memory element 9I at the ninth level. However, when the insulating adhesive layer 15 is too thick, the thinning of the semiconductor storage device 1 is blocked. Thus, the thickness of the insulating adhesive layer 15 is preferably 100 μm or less.

The memory element 9 at the lowermost level (ninth level) in the second memory element group 13 is disposed so that the pad arrangement side thereof can face the short side 3B of the wiring board 2. In other words, the memory elements 9 included in the second memory element group 13 are disposed so the pad arrangement sides thereof can be disposed in an opposite direction to those in the first memory element group 12. Accordingly, the electrode pads 10 of the memory elements 9 included in the second memory element group 13 are located in the vicinity of the second pad area 8B that are located on a side opposite to the first pad area 8A connected to the first memory element group 12.

The memory element 9 at the tenth level is adhered onto the memory element 9 at the ninth level with an adhesive layer (not shown) interposed therebetween, so that, while the electrode pads 10 of the memory element 9 at the ninth level are exposed, an electrode formation surface of the tenth-level memory element 9 faces upward, the electrode formation surface having the electrode pads 10 of the tenth-level memory element 9 thereon. The memory element 9 at the tenth level and the memory element 9 at the ninth level are disposed so that the pad arrangement sides thereof can face in the same direction. Similarly, the remaining six memory elements (memory elements at the eleventh to sixteenth levels) 9 in the second memory element group 13, are adhered onto the tenth-level memory element 9 and each other in sequence with the respective adhesive layers (not shown) interposed between every two memory elements so that the pad arrangement sides thereof can face in the same direction as that of the ninth-level memory elements 9, and that the short side of each memory element 9 can be offset from one another in the direction of a long side so as to the expose electrode pads 10 of the lower memory elements 9.

The eight memory elements 9 in the second memory element group 13 are layered so as to form such a stepped pattern that the stepped pattern faces in an opposite direction to a stepped pattern of the first memory element group 12. Thus, the pad arrangement sides in the second memory element group 12 face in the same direction (that is opposite direction to those in the first memory element group 12), and the short side of the memory elements 9 are offset from one another in the direction of the long side so as to expose the electrode pads 10 of the memory elements 9 at the lower levels. For the adhesive layer for the memory element 9 at the ninth level, the above-described insulating adhesive layer 15 serving as the spacer layer is used. For the adhesive layers for the memory elements 9 at the tenth to sixteenth levels, a generally-used die attach film (adhesive film) is used as in the adhesive layers of the first memory element group 12.

Since the second memory element group 13 has such a stepwise layer structure, the electrode pads 10 of each memory element 9 included in the second memory element group 13 are located in the vicinity of the second pad area 8B, while being exposed upward. The electrode pads 10 of the eight memory elements 9 included in the second memory element group 13 are electrically connected to the connection pads 7 with second metallic wires (Au wires or the like) 16, the connection pads 7 being disposed on the second pad area 8B. When electric characteristics, signal characteristics, and the like, of each electrode pads 10 are the same, the electrode pads can be connected in sequence with the second metallic wires 14. Wire bonding between the two electrode pads 10 may be individually performed, or the pads may be connected to each other with a single piece of metallic wire in sequence.

In the semiconductor storage device (semiconductor memory device) 1 of this embodiment, the step directions of the first memory element group 12 and the second memory element group 13 are opposite to each other, and the memory element 9 at the lowermost level (ninth level) in the second memory element group 13 is layered right on the memory element 9 at the uppermost level (eighth level) in the first memory element group 12. Accordingly, it is possible to reduce an occupied area of the wiring board 2 by the first and second memory element groups 12 and 13 while securing the width (an exposed width of the memory element 9 including the electrode pads 10, e.g., 320 μm) of each step portion in the first and second memory element groups 12 and 13. In other words, it is possible to increase the number of the layered memory elements 9 while maintaining the wire bonding characteristics for the memory elements 9.

To be more specific, when the memory element 9 at the lowermost level (ninth level) in the second memory element group 13 is disposed to expose the electrode pads 10 of the memory element 9 at the uppermost level (eighth level) in the first memory element group 12, the length in the step direction of the first and second memory element groups 12 and 13 is given by adding an offset amount of the memory element 9 at the ninth level to expose the electrode pads 10 of the memory element 9 at the eighth level to an offset amount provided for exposing the electrode pads 10 of the memory elements 9 at the first to seventh levels. However, since the size of the semiconductor storage device 1 that is a memory card or the like is predetermined, the size of the semiconductor memory device 1 according to the present invention may be deviated from the predetermined size due to the increase in the offset amount of the memory elements 9 (length in the step direction). In order to reduce the length in the step direction of the memory elements 9, an offset amount of each memory element 9 should be reduced, but in that case, it may become difficult to secure a width enabling wire bonding.

In light of the above points, in this embodiment, the memory element 9 at the lowermost level (ninth level) in the second memory element group 13 is layered right on the memory element 9 at the uppermost level (eighth level) in the first memory element group 12. Thus, by having layers with eight levels for each of the memory element groups 12 and 13, it becomes possible to reduce the length in the step direction of the memory element groups 12 and 13, i.e., to reduce the occupied area of the wiring board 2 by the memory element groups 12 and 13. To put it differently, the factor to increase the length in the step direction of the memory element groups 12 and 13 is only the offset amount provided for exposing the electrode pads 10 of the memory elements 9 at the first to seven levels (an amount of offset in the longitudinal direction) to expose, so that the offset amount in this case can be made small compared with a case where all the electrode pads of the memory elements at the eight levels are exposed.

When the memory element 9 at the ninth level is simply layered right on the memory element 9 at the eighth level, the following problems may result: a short circuit due to a poor insulation of the metallic wires 14 connected the electrode pads 10 of the memory element 9 at the eighth level; a poor connection of the metallic wires 14; or the like. For this reason, in this embodiment, the insulating adhesive layer 15 serving also as the spacer layer is used as the adhesive layer for the memory element 9 at the ninth level, so that the edge portion of the first metallic wire 14 connected to the electrode pad 10 of the eighth-level memory element 9 is embedded into the insulating adhesive layer 15. This prevents a poor insulation, a poor connection, and the like of the metallic wires 14. Accordingly, it becomes possible to provide the semiconductor storage device 1 in which the number of the layered memory elements 9 is increased, while maintaining wire bonding characteristics for the memory elements 9, reliability after wire bonding, and the like.

The layering of the memory element 9 at the ninth level right on the memory element 9 at the eighth level shows that the memory element 9 at the eighth level is present under the electrode pads 10 of the memory element 9 at the ninth level. Accordingly, there is no case that a space under the electrode pads 10 of the memory element 9 at the ninth level is completely empty. Thus, it becomes possible to maintain favorable wire bonding characteristics for the memory element 9 at the ninth level. When the memory element 9 at the ninth level is disposed while being offset, the layer structure is changed to an overhang structure, so that a flexure may occur at the time of wire bonding. The flexure of the memory element 9 may cause a poor connection, the cracking of the element, or the like. The semiconductor storage device 1 of this embodiment can restrict a poor connection, the cracking of the element, or the like due to the flexure of the memory element 9.

As described above, the wiring board 2 and the first and second memory element groups 12, 13 are electrically connected with the first and second metallic wires 14, 16. Of the electrode pads 10 of the eight memory elements 9 of each in the memory element groups 12 and 13, the electrode pads whose electric characteristics, signal characteristics, and the like are the same can be connected to each other in sequence with the metallic wires 14 and 16. However, in some cases, electrode pads for a control signal such as an element selection (chip selection) need to be connected to the connection pads 7 of the wiring board 2 individually. In such a case, since the memory element groups 12 and 13 each include the memory elements 9 at eight levels, the wiring of the metallic wires 14 and 16 may become difficult.

For example, the first and second memory element groups 12 and 13 are each classified into two element subgroups depending on a control signal from the controller element 11. The first memory element group 12 is classified into a first element subgroup of the memory elements 9 at the first to fourth levels and a second element subgroup of the memory elements 9 at the fifth to eighth levels. Similarly, the second memory element group 13 is classified into a third element subgroup of the memory elements 9 at the ninth to twelfth levels and a fourth element subgroup of the memory elements 9 at the thirteenth to sixteenth levels. In this case, it is necessary to connect the metallic wires 14 (16) to the second element subgroup (or the fourth element subgroup) while avoiding the metallic wires 14 (16) connected to the first element subgroup (or the third element subgroup). However, when the memory elements 9 are multi-layered such that the number of the layered memory elements 9 is eight, a contact between the metallic wires may not be avoidable.

Therefore, in this embodiment, the eight memory elements 9 included in the first memory element group 12 are disposed so that the second element subgroup (the memory elements 9 at the fifth to eighth levels) is offset from the first element subgroup (the memory elements 9 at the first to fourth levels) in the arrangement direction of the electrode pads 10. Specifically, the second element subgroup is disposed in a way that each set of four electrode pads 10 of the memory elements 9 at the fifth to eighth levels included in the second element subgroup is positioned between two neighboring sets of four electrode pads 10 of the memory elements 9 at the first to fourth levels included in the first element subgroup, when viewed from the short side 3B. This displacement is also applied to the second memory element group 13. That is, the fourth element subgroup (the memory elements 9 at the ninth to twelfth levels) is disposed to be offset from the third element subgroup (the memory elements 9 at the thirteenth to sixteenth levels) in the arrangement direction of the electrode pads 10.

For example, when the electrode pads 10 are disposed at an interval of 226 μm, the second element subgroup (or the fourth element subgroup) is disposed to be offset from the first element subgroup (or the third element subgroup) only by a distance (113 μm) that is half of the pad interval (226 μm), for example, in the arrangement direction of the electrode pads 10. FIG. 7 shows a state where a fourth element subgroup 13B in the second memory element group 13 is offset toward the long side 4A from a third element subgroup 13A. The fourth element subgroup 13B is disposed to be offset from the third element subgroup in the arrangement direction of the electrode pads 10, whereby the set of the electrode pads 10 of the memory elements 9 at the thirteenth to sixteenth levels is positioned between the two sets of the electrode pads 10 of the memory elements 9 at the ninth to twelfth levels, when viewed from the short side 3B. The first and second element subgroups of the first memory element group 12 are also disposed in the same manner.

A specific connection mode of the multiple element subgroups in the memory element groups 12 and 13 will be described with reference to FIGS. 10 to 12. The first memory element group 12 and the second memory element group 13 have similar configurations, so that the first memory element group 12 is herein described as an example. Of the electrode pads 10 of the memory elements 9A to 9H at the first to eighth levels, some electrode pads 10 of the memory elements 9A to 9H at the first to eighth levels are connected in sequence to a data signal terminal (IO) or the like with data signal metallic wires 14a as shown in FIGS. 10 and 11.

On the other hand, for terminals for control signal such as an element selection (chip selection) (CE (Chip enable), RB (Ready/Busy), element selection, and the like), a first element subgroup 12A and a second element subgroup 12B need to be separately connected to the connection pads 7 of the wiring board 2 electrically. For example, with the first element subgroup 12A and the second element subgroup 12B being separated, the element selection is controlled. For the first element subgroup 12A, the element selection is made by checking the conducting states of element selection 0 terminals and element selection 1 terminals of the memory elements 9A to 9D at the first to fourth levels. The same element selection is made for the second element subgroup 12B by checking the conducting states of element selection 0 terminals and element selection 1 terminals of the memory elements 9E to 9H at the fifth to eighth levels.

Figure 10:
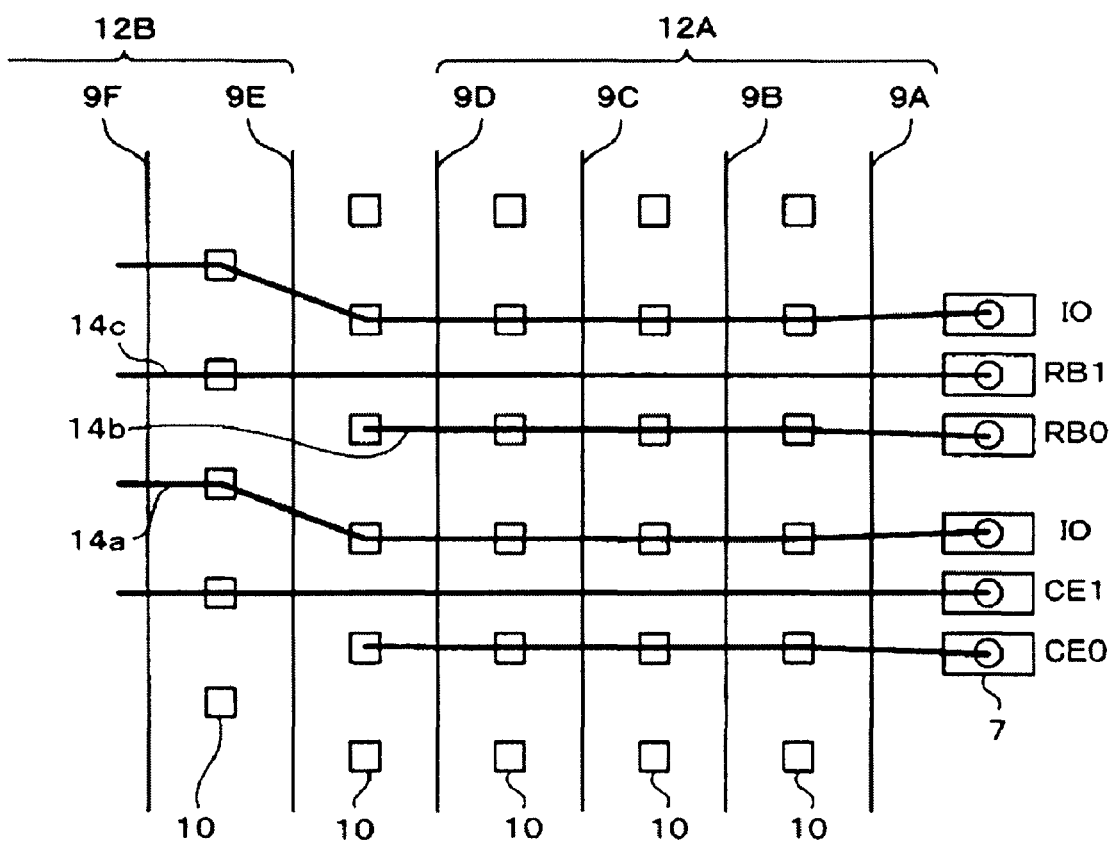
FIG. 10 is a diagram showing a connection state between memory elements and a wiring board included in the semiconductor storage device shown in FIG. 7.
Figure 11:
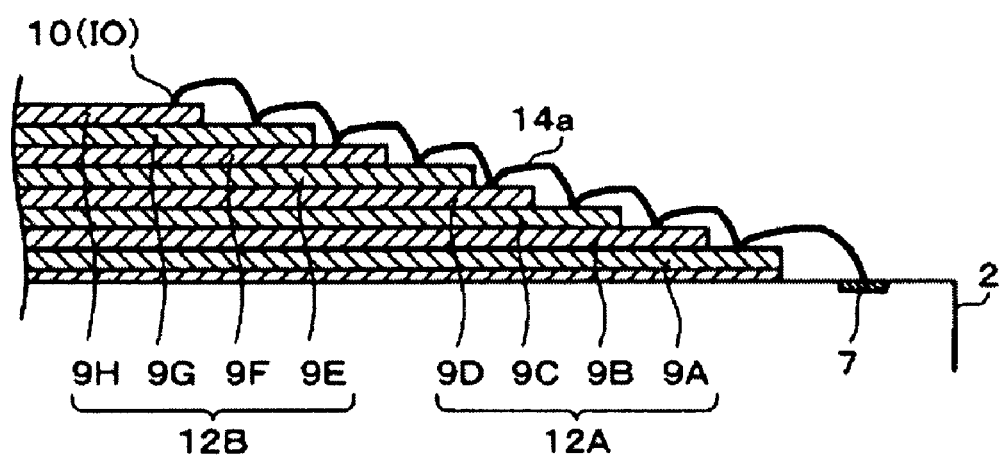
FIG. 11 is a diagram showing a connection state, with metallic wires for data signal, between the memory elements and the wiring board included in the semiconductor storage device shown in FIG. 7.
Figure 12:
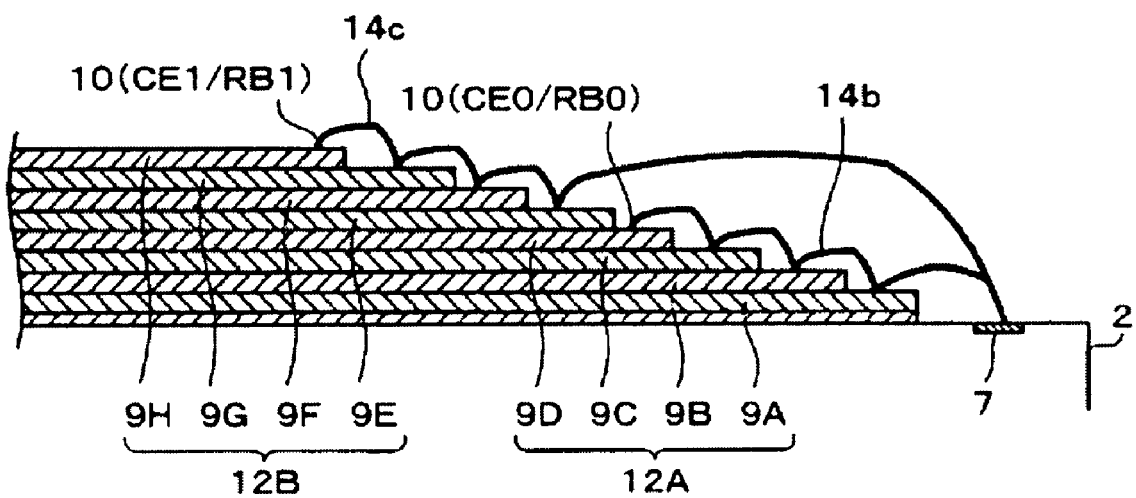
FIG. 12 is a diagram showing a connection state, with metallic wires for control signal, between the memory elements and the wiring board included in the semiconductor storage device shown in FIG. 7.

As shown in FIGS. 10 and 12, of the electrode pads 10 of the first element subgroup 12A, the four electrode pads 10 are connected to each other in sequence and to a CE terminal or an RB terminal with a first control signal metallic wire 14b. Then, the electrode pad 10 of the memory element 9A at the first level is connected to the connection pad 7 with the first control signal metallic wire 14b. This is similar in the case of the second element subgroup 12B. Specifically, the four electrode pads 10 of the second element subgroup 12B are connected to each other in sequence and to a CE terminal or an RB terminal with a first control signal metallic wire 14c. Then, the electrode pad 10 of the memory element 9E at the fifth level is connected to the connection pad 7 are connected with second control signal metallic wire 14c.

For the first control signal metallic wire 14b, since the connection pad 7 and the electrode pad 10 of the memory element 9A at the first level in the vicinity of the connection pad 7 are connected to each other, usual wire bonding does not create any problem. Meanwhile, for the second control signal metallic wire 14c, the connection pad 7 and the electrode pad 10 of the memory element 9E at the fifth level need to be connected to each other by skipping the electrode pads 10 of the memory elements 9A to 9D at the first to fourth level, and using the wire 14c. Therefore, depending on a layer structure of the memory element 9, the second control signal metallic wire 14c may come into contact with the first control signal metallic wire 14b which is placed below the second control signal metallic wire 14c.

For example, when the memory elements 9A to 9H at the first to eighth levels are simply layered stepwise with the long sides aligned with one another, the wiring of the second control signal metallic wire 14c is made over the first control signal metallic wire 14b, so that these wires tend to come into contact with each other. Furthermore, even if the second control signal metallic wire 14c has a larger entering angle, when, for example, eight or more of the memory elements 9 are layered stepwise, a contact between the second control signal metallic wire 14c and the first control signal metallic wire 14b may not be avoidable since the entering angle has a limitation.

In light of the above point, in this embodiment, the second element subgroup 12B is disposed to be offset from the first memory element group 12, and thereby each set of four electrode pads 10 of the memory elements 9E to 9H at the fifth to eighth levels is disposed between two neighboring sets of four electrode pads 10 of the memory element 9A to 9D at the first to fourth levels, when viewed from the short side 3B. Therefore, as shown in FIG. 10, the wiring of the second control signal metallic wire 14c is made possible between every two of the electrode pads 10 of the memory elements 9A to 9D at the first to fourth levels without increasing the entering angle. Accordingly, when the second control signal metallic wire 14c is connected to the second element subgroup 12B, the contact with the first control signal metallic wire 14b is restrained. This is similar in the case of the third and fourth subgroups of the second memory element group 13.

Onto the second memory element group 13 (the memory element 9 at the sixteenth level, to be more specific), the controller element 11 is adhered with the adhesive layer (not shown) interposed therebetween. The controller element 11 has a U-shape pad structure with electrode pads 17A, 17B, and 17C arranged respectively along a first outer side, a second outer side, and a third outer side. Of these electrode pads 17A to 17C, the electrode pads 17A located in the vicinity of the third pad area 8C are electrically connected to the connection pads 7 disposed in the third pad area 8C with metallic wires 18A.

The electrode pads 17B located in the vicinity of the first pad area 8A are electrically connected to the connection pads 7 located in the first pad area 8A with metallic wires 18B. For the electrode pads 17C arranged along the third outer side, it is difficult to be directly connected to the connection pads 7 located in the first pad area 8A, so that a relay element 19 is disposed adjacent to the controller element 11. The electrode pads 17C arranged along the third outer side are connected to the connection pads 7 located in the first pad area 8A via the relay element 19.

The relay element 19 has electrode pads (relay pads) 20A and 20B arranged respectively along one outer side and another outer side perpendicular thereto. The relay element 19 is disposed so that the electrode pads 20A can face the electrode pads 17C of the controller element 11, and that the electrode pads 20B can be located in the vicinity of the first pad area 8A. The electrode pads 20A of the relay element 19 are connected to the electrode pads 17C of the controller element 11 with relay metallic wires 21A. The electrode pads 20B are connected to the connection pads 7 with relay metallic wires 21B. The relay element 19 includes a wiring layer connecting the electrode pads 20A to the electrode pads 20B. Accordingly, the electrode pads 17C of the controller element 11 is electrically connected to the connection pads 7 disposed in the first pad area 8A via the relay element 19.

On the second principal surface 2b, of the wiring board 2, on which the memory elements 9 and the controller element 10 are mounted, a sealing resin layer 22 formed of, for example, an epoxy resin is molded. The memory elements 9 and the controller element 11 together with the metallic wires 14, 16, 18, and the like are integrally sealed with the sealing resin layer 22. At a front end of the sealing resin layer 22, an inclining portion 23 indicative of the front of the memory card is provided. At the rear of the sealing resin layer 22, a grip portion 24 that is a partly risen sealing resin is provided. On the basis of the above, the semiconductor storage device 1 to be used as a semiconductor memory card is configured. The sealing resin layer 22 is omitted in FIG. 7.

The semiconductor storage device 1 is a device which alone constitutes a semiconductor memory card (e.g., a microSD (trademark) card) without a housing case such as a base card. Accordingly, the sealing resin layer 22 and the like remain exposed directly to the outside. In other words, the semiconductor storage device 1 is used as a caseless semiconductor memory card having the sealing resin layer 22 and the like being exposed to the outside. Therefore, the notch portion and the constricted portion indicative of the front/rear of and the top side/bottom side of the memory card described above as well as the inclining portion 23 are directly provided to the semiconductor storage device 1.

The thicknesses of the memory elements 9 included in the first memory element group 12 are not necessarily limited. However, it is preferable that the thickness of the memory element 9 at the lowermost level (the first level) be larger than those of the other memory elements 9. The memory element 9 at the first level is disposed on a roughened portion on the surface of the wiring board 2 (the roughened portion due to a step present depending on the presence/absence of a wiring layer, a step present on a through-hole portion, a step present on a terminal or a test pad, and the like), so that high pressure is locally applied to the memory element 9 at the first level at the time of molding the sealing resin layer 22. Thus, when the thickness of the memory element 9 at the first level is too small, the memory element 9 may break due to the pressure locally caused at the time of molding.

Therefore, of the eight memory elements 9 included in the first memory element group 12, the thickness T1 of the memory element 9 at the first level is preferably larger than that T2 of each of the memory elements 9 at the second to eighth levels (T1>T2). The thickness T1 of the memory element 9 at the first level is in the range of, for example, 40 to 50 µm. For the restriction of an increase of the layer thickness, the thickness T2 of each of the other memory elements 9 (at the second to eighth levels) is in the range of, for example, 10 to 40 µm. When the thickness T2 exceeds 40 µm, the layer thickness of memory elements 9 is increased. Setting the thickness T2 to less than 10 µm is difficult in terms of element manufacturing processes, and the memory element 9 tends to break at the time of manufacturing or of handling.

The thicknesses of the memory elements 9 included in the second memory element group 13 are not necessarily limited, either. However, it is preferable that the thickness T3 of the memory element 9 at the lowermost level (the ninth level) be larger than the thickness T4 of each of the other memory elements (at the tenth to sixteenth levels) 9 (T3>T4). The memory element 9 at the ninth level is supported with the memory element 9 at the eighth level, but this supporting structure is inferior to those of the other memory elements 9. For this reason, it is preferable that for example, the thickness T3 of the memory element 9 at the ninth level be larger, e.g., in the range of 25 to 40 µm, than the thickness T4 of each of the other memory elements 9. The thickness T4 of each of the other memory elements 9 (at the tenth to sixteenth levels) is in the range of, for example, 10 to 25 µm.

When a memory card is configured by the semiconductor storage device 1, the thickness of the memory card is equivalent to that acquired by adding the thickness of the sealing resin layer 22 on the controller element 11 (the thickness of resin over the element) and the thickness of the wiring board 2 to the layer thickness of the memory elements 9 and the controller element 11. For example, suppose a case where the thickness of the wiring board 2 is set to 110 µm, that of the memory element 9 at the first level to 45 µm, that of the adhesive layer thereof to 15 µm, that of each of the memory elements 9 at the second to eighth levels and at the tenth to sixteenth levels to 20 µm, that of each adhesive layer thereof to 5 µm, that of the memory element 9 at the ninth level to 30 µm, that of the adhesive layer thereof to 50 µm, that of the controller element 11 to 20 µm, that of the adhesive layer thereof to 5 µm, and that of the resin over the elements of the sealing resin layer 22 on the device to 145 µm. In this case, the total thickness thereof is 770 µm. This makes it possible to manufacture a thin and high capacity semiconductor storage device 1 which is highly reliable.

For the manufacturing of an ultra thin semiconductor memory element 9 having a thickness of 10 to 40 µm, the following manufacturing method is preferably applied. Specifically, first, prepared is a semiconductor wafer having an element area on the top surface thereof. The top surface of the semiconductor wafer is grooved at a predetermined depth using a blade or the like. The depth of the groove thus formed is set larger than the thickness of an element at the time of completing the manufacturing. Subsequently, a protective tape is applied to the top surface of the semiconductor wafer with the groove formed therein. Thereafter, the bottom surface of the semiconductor wafer is ground and polished to a desired element thickness. Through the grinding and polishing processes to the depth of the groove, semiconductor memory devices are divided into pieces, with the protective tape maintained on the semiconductor wafer.

Next, to the bottom surface of the semiconductor wafer, a protective tape integrated with an adhesive film (a die attach film or the like) is applied, and only the protective tape is peeled off. After that, a laser beam is directed along the shapes of semiconductor elements divided with the grooves. Thereby, the adhesive film adhered to the bottom surface of the semiconductor wafer is cut according to the shapes of the semiconductor memory devices so as to acquire the divided semiconductor memory devices each having the adhesive film. In this manner, by the combination of Dicing Before Grinding on the semiconductor wafer and the cutting of the adhesive film with a laser beam enables a favorable reproductivity of an ultra thin semiconductor element with an adhesive film adhered thereon.

In the semiconductor storage device 1 of this embodiment, the number of the mounted memory elements 9 (number of layers) is not limited to sixteen. It is only necessary that each one of the first and second memory element groups 12 and 13 includes multiple memory elements 9. However, to increase the capacity of semiconductor storage device 1, it is preferable that the number of memory elements 9 included in each of the first and second memory element groups 12 and 13 be eight or more (sixteen or more in total). For example, use of the sixteen memory elements 9 each having a storage capacity of 1 GB enables the manufacturing of a semiconductor memory card with 16 GB. In other words, according to the semiconductor storage device 1, it becomes possible to provide a thin and high capacity memory card or the like with high reliability.

The semiconductor storage device in each embodiment described above is an effective device as a caseless semiconductor memory card configured by itself, but it does not exclude a semiconductor memory card with a case. In addition, the semiconductor storage device is applicable other than the semiconductor memory card. To be more specific, the device structure of each embodiment is also applicable to a semiconductor storage device having a BGA package structure or an LGA package structure. The basic structure of such a semiconductor package is the same as that of the semiconductor storage device 1, except that, on the first principal surface 2a of the wiring board 2, an external connection terminal (a ball terminal) formed of a solder ball or the like is provided.

The semiconductor memory device and the semiconductor storage device of the present invention are not limited to the above embodiments, but are applicable to various semiconductor storage devices and the like in each of which multiple memory elements are mounted on a wiring board in a layered fashion. Various modifications can be made on the specific structures of the semiconductor memory device and the semiconductor storage device of the present invention as long as such modifications satisfy the basic configuration of the present invention. The embodiments can be expanded or altered within the range of technological ideas of the present invention, and the expanded or altered embodiment is also included within the technological scope of the present invention.

The invention claimed is:

1. A semiconductor memory device comprising:
    a wiring board including an element mounting portion and connection pads;
    a first element group including a plurality of semiconductor elements each having electrode pads arranged along one of outer sides of the semiconductor element, the plurality of semiconductor elements being layered stepwise on the element mounting portion of the wiring board in a way that pad arrangement sides of the semiconductor elements face in the same direction, and that the electrode pads are exposed;
    a second element group including a plurality of semiconductor elements each having electrode pads arranged along one of outer sides of the semiconductor element, the plurality of semiconductor elements being layered stepwise on the first element group in a way that pad arrangement sides of the semiconductor elements face in the same direction as that of the first element group, and that the electrode pads are exposed, the second element group being disposed to be offset from the first element group in an arrangement direction of the electrode pads;
    a memory controller element;
    metallic wires for electrically connecting the electrode pads of the plurality of semiconductor elements included in the first and second element groups to the connection pads of the wiring board; and
    a sealing resin layer formed on the wiring board so as to seal the first and second element groups together with the metallic wires,
    wherein the second element group is disposed in a way that each of the electrode pads of the plurality of semiconductor elements included in the second element group is positioned between a corresponding pair of the neighboring electrode pads of the plurality of semiconductor elements included in the first element group,
    the first element group and the second element group are a first memory element group and a second memory element group, respectively, and
    the memory controller element is layered on the second memory element group and includes electrode pads arranged along at least one of outer sides of the memory controller element.

2. The semiconductor memory device according to claim 1, wherein
    the metallic wires include:
    data signal metallic wires for connecting some of the electrode pads of a plurality of memory elements included in the first and second memory element groups to one of the connection pads of the wiring board in sequence;
    first control signal metallic wires for connecting some of the electrode pads of the plurality of memory elements included in the first memory element group to respectively corresponding ones of the connection pads of the wiring board in sequence; and
    second control signal metallic wires for connecting some of the electrode pads of the plurality of memory elements included in the second memory element group to respectively corresponding ones of the connection pads of the wiring board in sequence, and
    the second control signal metallic wires each are wired between corresponding pairs of the neighboring electrode pads of the plurality of memory elements included in the first memory element group.

3. The semiconductor memory device according to claim 2, wherein
    the memory element included in the first and second memory element groups is a nonvolatile semiconductor storage device.

4. The semiconductor memory device according to claim 3, wherein
    the memory elements included in the first and second memory element groups have the same shape.

5. The semiconductor memory device according to claim 4, wherein
    first electrode pads of the respective memory elements in the first and second memory element groups are connected in sequence to a first connection pad of the wiring board with a first metallic wire, second electrode pads, adjacent to the first electrode pads, of the respective memory elements in the first memory element group are connected in sequence to a second connection pad of the wiring board with a second metallic wire, and the second electrode pads of the respective memory elements in the second memory element group are connected in sequence to a third connection pad between the first connection pad and the second connection pad of the wiring board with a third metallic wire.

6. A semiconductor memory device comprising:

a wiring board including an element mounting portion and connection pads;

a first semiconductor element group including a plurality of semiconductor elements each having electrode pads arranged along one of outer sides of the semiconductor element, the plurality of semiconductor elements being layered on the element mounting portion of the wiring board so as to form such a stepped pattern that pad arrangement sides of the semiconductor elements face in the same direction, and that the electrode pads are exposed;

a second semiconductor element group including a plurality of semiconductor elements each having electrode pads arranged along one of outer sides of the semiconductor element, the plurality of semiconductor elements being layered on the first semiconductor element group so as to form such a stepped pattern that the stepped pattern faces in an opposite direction to the stepped pattern of the first semiconductor element group, that pad arrangement sides of the semiconductor elements face in the same direction, and that the electrode pads are exposed;

first metallic wires for electrically connecting some of the electrode pads of the plurality of semiconductor elements included in the first semiconductor element group to respectively corresponding ones of the connection pads of the wiring board;

second metallic wires for electrically connecting some of the electrode pads of the plurality of semiconductor elements included in the second semiconductor element group to respectively corresponding ones of the connection pads of the wiring board;

a sealing resin layer formed on the wiring board so as to seal the first and second semiconductor element groups together with the first and second metallic wires, wherein a lowermost semiconductor element in the second semiconductor element group is layered right on an uppermost semiconductor element in the first semiconductor element group with an insulating adhesive layer interposed therebetween, the insulating adhesive layer serving as a spacer layer, and an element-side edge portion of each of the first metallic wires connected to the uppermost semiconductor element is embedded into the insulating adhesive layer.

7. The semiconductor memory device according to claim 6, wherein at least one of the first and second semiconductor element groups is classified into two or more element subgroups, and these two or more element subgroups are disposed to be offset from each other in an arrangement direction of the electrode pads.

8. The semiconductor memory device according to claim 6, further comprising:

a memory controller element; and third metallic wires, wherein the first semiconductor element group and the second semiconductor element group are a first memory element group and a second memory element group, respectively, the memory controller element is layered on the second memory element group and includes electrode pads arranged along at least one of outer sides of the memory controller element; and the third metallic wires electrically connect the electrode pads of the controller element to the connection pads of the wiring board.

9. The semiconductor memory device according to claim 8, wherein at least one of the first and second semiconductor element groups is classified into two or more element subgroups, and these two or more element subgroups are disposed to be offset from each other in an arrangement direction of the electrode pads.

10. The semiconductor memory device according to claim 7, wherein when T1 represents a thickness of a lowermost memory element in the first memory element group, T2 represents a thickness of each of the other memory elements in the first memory element group, T3 represents a thickness of a lowermost memory element in the second memory element group, and T4 represents a thickness of each of the other memory elements in the second memory element group, the first memory element group satisfies T1>T2, and the second memory element group satisfies T3>T4.

11. The semiconductor memory device according to claim 9, wherein when T1 represents a thickness of a lowermost memory element in the first memory element group, T2 represents a thickness of each of the other memory elements in the first memory element group, T3 represents a thickness of a lowermost memory element in the second memory element group, and T4 represents a thickness of each of the other memory elements in the second memory element group, the first memory element group satisfies T1>T2, and the second memory element group satisfies T3>T4.

12. The semiconductor memory device according to claim 10, wherein the memory element included in the first and second memory element groups is a nonvolatile semiconductor storage device.

13. The semiconductor memory device according to claim 10, wherein the memory elements included in the first and second memory element groups have the same shape.

14. The semiconductor memory device according to claim 13, wherein first electrode pads of the respective memory elements in the first and second element subgroups are connected in sequence to a first connection pad of the wiring board with a primary metallic wire, second electrode pads, adjacent to the first electrode pads, of the respective memory elements in the first element subgroup are connected in sequence to a second connection pad of the wiring board with a secondary metallic wire, and the second electrode pads of the respective memory elements in the second element subgroup are connected in sequence to a third connection pad between the first connection pad and the second connection pad of the wiring board with a tertiary metallic wire.

15. The semiconductor memory device according to claim 11, wherein
the memory element included in the first and second memory element groups is a nonvolatile semiconductor storage device.

16. The semiconductor memory device according to claim 11, wherein
the memory elements included in the first and second memory element groups have the same shape.

17. The semiconductor memory device according to claim 16, wherein
first electrode pads of the respective memory elements in the first and second element subgroups are connected in sequence to a first connection pad of the wiring board with a primary metallic wire,
second electrode pads, adjacent to the first electrode pads, of the respective memory elements in the first element subgroup are connected in sequence to a second connection pad of the wiring board with a secondary metallic wire, and
the second electrode pads of the respective memory elements in the second element subgroup are connected in sequence to a third connection pad between the first connection pad and the second connection pad of the wiring board with a tertiary metallic wire.

18. A semiconductor memory device comprising:
a wiring board including an element mounting portion and connection pads;
a first memory element group including a plurality of memory elements each having electrode pads arranged along one of outer sides of the memory element, the plurality of memory elements being layered on the element mounting portion of the wiring board so as to form such a stepped pattern that pad arrangement sides of the memory elements face in the same direction, and that the electrode pads are exposed;
a second memory element group including a plurality of memory elements each having electrode pads arranged along one of outer sides of the memory element, the plurality of memory elements being layered on the first memory element group so as to form such a stepped pattern that the stepped pattern faces in an opposite direction to the stepped pattern of the first memory element group, that pad arrangement sides of the memory elements face in the same direction, and that the electrode pads are exposed;
first metallic wires for electrically connecting some of the electrode pads of the plurality of memory elements included in the first memory element group to respectively corresponding ones of the connection pad of the wiring board;
second metallic wires for electrically connecting some of the electrode pads of the plurality of memory elements included in the second memory element group to respectively corresponding ones of the connection pads of the wiring board;
a memory controller element being layered on the second memory element group and including electrode pads arranged along at least one of outer sides of the memory controller element;
third metallic wires for electrically connecting the electrode pads of the controller element to the connection pads of the wiring board;
a sealing resin layer formed on the wiring board so as to seal the first and second memory element groups and the memory controller element together with the first, second, and third metallic wires, wherein
at least one of the first and second memory element groups is classified into two or more element subgroups, and
these two or more element subgroups are disposed to be offset from each other in an arrangement direction of the electrode pads,
first electrode pads of the respective memory elements in the first and second element subgroups are connected in sequence to a first connection pad of the wiring board with a primary metallic wire,
second electrode pads, adjacent to the first electrode pads, of the respective memory elements in the first element subgroup are connected in sequence to a second connection pad of the wiring board with a secondary metallic wire, and
the second electrode pads of the respective memory elements in the second element subgroup are connected in sequence to a third connection pad between the first connection pad and the second connection pad of the wiring board with a tertiary metallic wire.

* * * * *